(12) United States Patent
Martinez

(10) Patent No.: US 6,687,862 B1
(45) Date of Patent: Feb. 3, 2004

(54) APPARATUS AND METHOD FOR FAST MEMORY FAULT ANALYSIS

(75) Inventor: Antonio Martinez, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 564 days.

(21) Appl. No.: 09/663,307

(22) Filed: Sep. 15, 2000

(51) Int. Cl.[7] .............................................. G11C 29/00
(52) U.S. Cl. ...................................................... 714/723
(58) Field of Search ............................. 714/5, 7, 8, 42, 714/54, 710, 711, 718, 719, 723, 733–737, 743, 819, 824; 365/200, 201

(56) References Cited

U.S. PATENT DOCUMENTS

| | | | |
|---|---|---|---|
| 6,041,422 A | * | 3/2000 | Deas .............................. 714/8 |
| 6,304,989 B1 | * | 10/2001 | Kraus et al. ................. 714/733 |
| 6,408,401 B1 | * | 6/2002 | Bhavsar et al. ................. 714/7 |
| 6,535,993 B1 | * | 3/2003 | Hamada et al. ................. 714/6 |

* cited by examiner

*Primary Examiner*—Albert Decady
*Assistant Examiner*—Matthew C. Dooley

(57) ABSTRACT

A memory fault analyzer having a comparator and fault analyzer storage is disclosed along with a method of testing faults of the memory using a built in fault analyzer. The memory is tested by writing a known data onto a bit, reading the bit for stored data, comparing the known data with the stored data, and storing address of faulty bits in the fault analyzer. Because the fault analyzer is built in with the memory, the process is very fast. And, the fault analyzer may count the number of rows and the number of columns requiring replacement, compare the counted numbers with the number of available redundant rows and columns, and generate a repairability signal.

24 Claims, 3 Drawing Sheets

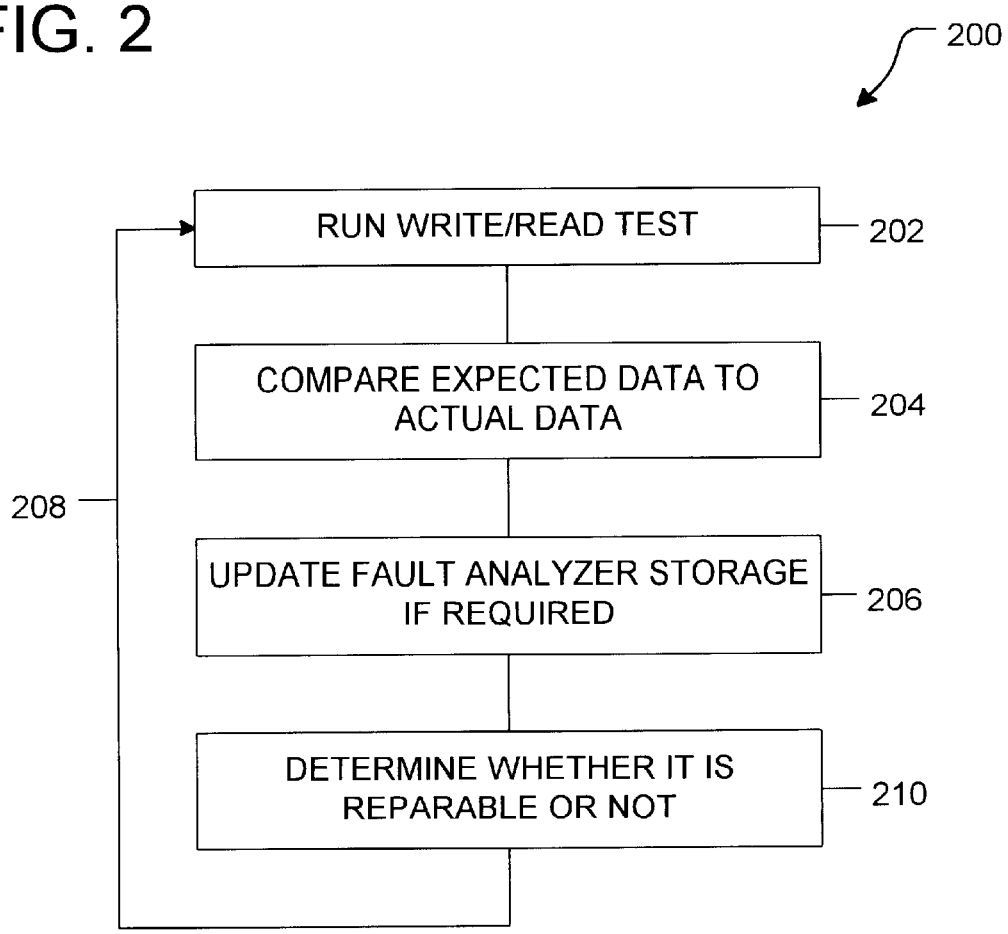

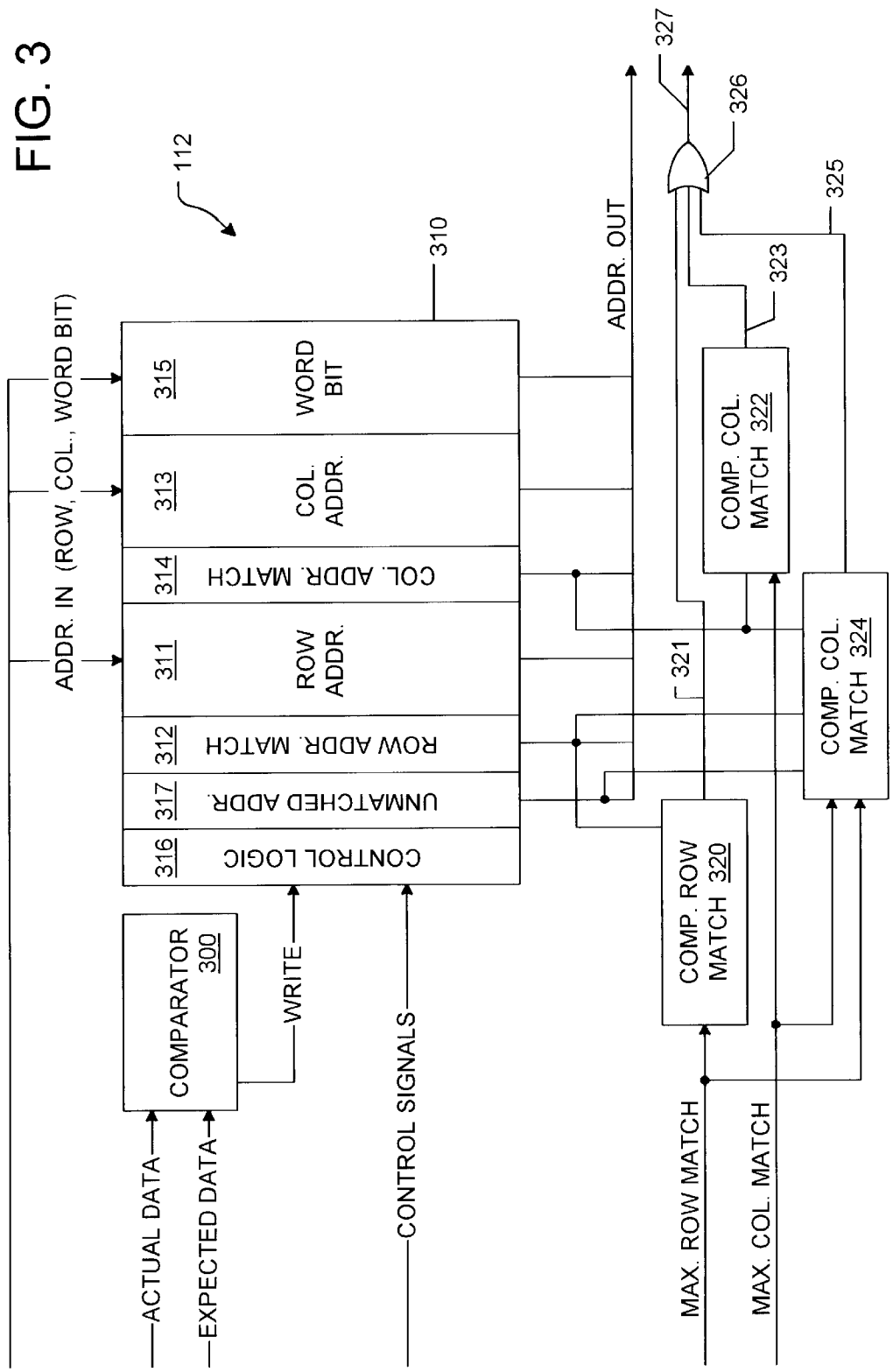

APPARATUS AND METHOD FOR FAST MEMORY FAULT ANALYSIS

BACKGROUND

The present invention relates to memory testing method and apparatus. More specifically, the present invention relates to a method of quickly testing computer memory, and computer memory having a fault analyzer.

DRAM (Dynamic Random Access Memory) testing times are very long compared to ASIC (Application Specific Integrated Circuits or standard logic) testing times. Typically DRAM testing takes one to two minutes compared to two to ten seconds for standard logic, depending on organization and complexity. This is because, for the most part, DRAM pin counts are typically much lower than ASIC pin counts. For example, a 64 Meg DRAM organized as ×8 has 32 pins compared to typically more than 200 pins for ASICs. Lower DRAM pin count constrains data throughput and increase testing times since it takes longer to load and verify test patterns. Further, test failures are downloaded to an external, slower hardware or software program where they are analyzed off-line to determine DRAM repairability.

Memory such as DRAM stores bits organized in a grid of rows and columns where each bit is a binary digit. To increase yield of usable chips, DRAMs are typically manufactured containing a number of redundant, or spare, rows, redundant columns, or both. When a faulty bit is found, the row or the column containing the faulty bit is replaced by one of the redundant rows or redundant columns. A DRAM is repairable when the number of redundant rows is greater than or equal to the number of rows requiring replacement by a redundant row and the number of redundant columns is greater than or equal to the number of columns requiring replacement by a redundant column. If this condition is not met, then the DRAM is not repairable. Determining repairability depends on determining defect clustering from the raw data stream of addresses (column and row) and failed data bits in each word. If a DRAM can be repaired, the DRAM is then repaired through laser zapping to activate good columns or rows and retested to determine usability. The process of determining repairability, offline repair, and retesting requires additional testing time.

When memory is embedded inside an ASIC, testing and repairing the memory is even more difficult and costly. This is due to longer test times, extra hardware, and additional handling steps to analyze and determine the memory's repairability. An ASIC tester is required to handle the complexities associated with ASICs (greater number of signals, higher signal frequencies or varying signal interfaces). Unlike DRAM testers, ASIC testers typically handle one part at a time, usually due to the higher pin counts (higher than 200, typically). Suppliers rely on the greater number of signal pins and higher frequencies, even BIST (built-in self test), to speed up logic and embedded memory testing. But as DRAM exceed one Megabits and beyond, an ASIC tester will exceed practical limits due to longer test patterns or wider words, or both. A similar repairability analysis to that done in DRAM testers must also be performed external to the ASIC tester. Also, ASIC testers and BIST focus on detecting failures not determining repairability. ASIC testers could keep track of fault locations but at the cost of additional external hardware and software with longer test times.

The DRAM testing times may be reduced through BIST techniques and by using wide words (wider data throughput), but the reduction is not significant, especially for large DRAMs of one Megabit or more. Similar problems exist for other types of memory modules such as Flash, EEPROM (electrically erasable programmable read-only memory), large SDRAM (Synchronous DRAM), and others where long testing times and determining repairability are required.

Other techniques have been used to reduce DRAM testing times. For example, external, highly specialized DRAM testers have been used to test between 16 to 64 devices at a time to compensate for the lower data throughput. In essence, testing multiple memory devices at the same time reduces per-chip testing time to about two to four seconds. However, this approach does not reduce the testing time for each DRAM.

Accordingly, there is a need for a method and apparatus for faster memory fault analysis.

SUMMARY

These needs are met by the present invention. According to one aspect of the present invention, a storage apparatus includes memory having addressable storage locations and fault analyzer for storing address of a fault location within the memory. Because the fault analyzer is within the storage apparatus, the memory can be tested quickly.

According to another aspect of the present invention, a technique of testing a memory device having addressable location is disclosed. First, expected data and actual data are compared. Then, when the expected data is not equal to the actual data, the address of memory location is stored within the memory device.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 2 is a flowchart illustrating the technique of the present invention; and

FIG. 3 illustrates a fault analyzer in accordance with one embodiment of the present invention.

DETAILED DESCRIPTION

Figure 1:
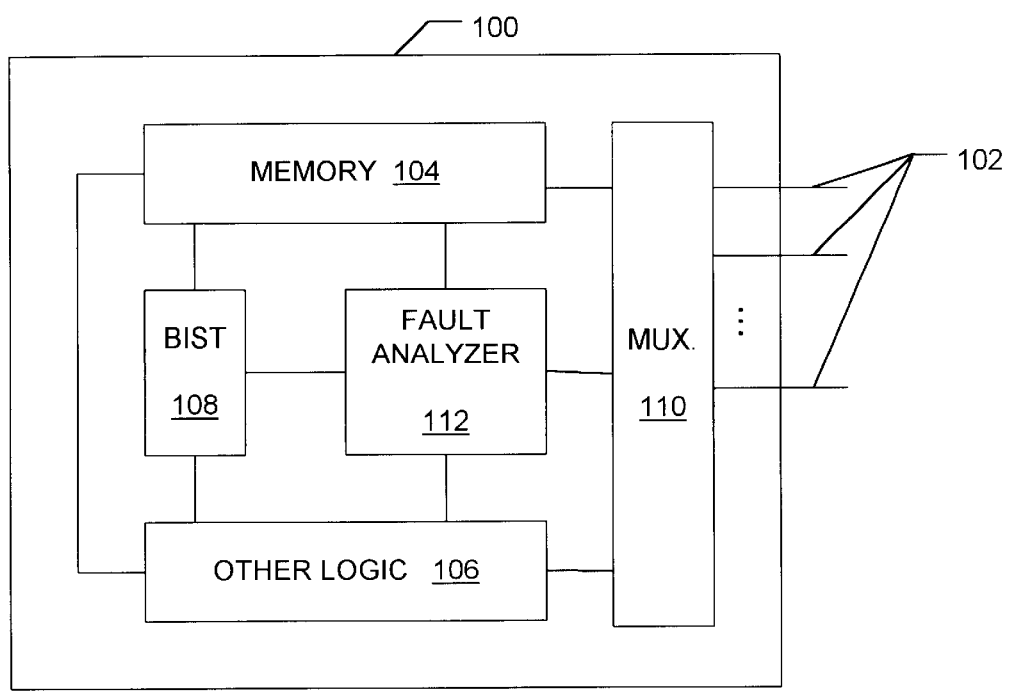
FIG. 1 is a simplified diagram illustrating a storage device in accordance with one embodiment of the present invention.

As shown in the drawings for purposes of illustration, the present invention is embodied in a storage device which allow for fast repairability analysis. The storage device has memory having addressable storage locations and fault analyzer within the storage device for determining whether the location being tested is good or bad and for storing, within the fault analyzer, bad memory addresses. Because the test data need not leave the storage device, the low pin-count of the storage device is removed as a bottleneck. The storage device may be a DRAM, an ASIC containing memory, or other device having memory where long testing times and repairability determination are required. For the purposes of our discussion, phrase "faulty bit" is used interchangeably with phrase "fault location."

FIG. 1 is a simplified diagram illustrating a storage device 100 in accordance with one embodiment of the present invention. The device 100 has pins 102 allowing the device 100 to be connected to external circuits and logic. The device 100 includes memory 104 having addressable locations. The memory 104 may be connected to other logic circuits 106 of the device 100. If the device 100 is an ASIC, for example, the other logic circuit 106 may include a processor, ROM (read only memory), or other programmable logic. The device 100 may also include a BIST circuit 108 for testing the memory 104. BIST technology is known in the art. Alternatively, the memory 104 may be tested by an external tester (not shown) connected to the memory 104 via the pins 102. A multiplexer 110 may be used to multiplex the pin connections (input and output lines, or I/O) to the memory 104, to other logic 106, a fault analyzer 112, or any combination of them.

Typically, memory is tested by writing, for each address or location, a known data value (the "expected data" or "expected value") and reading, from the same address, the stored value. The expected data may be written on the memory 104 by the BIST 108 or an external tester system (not shown). If the stored value is same as the expected value, then memory at that address is deemed to be good. But, if the stored value and the expected value do not agree, then memory at that address is deemed to be bad. In the prior art, each memory address is read by an external system (not shown) connected to the memory 104 via the pins 102. As already discussed, the low pin count causes testing delay in that configuration.

The storage device 100 according to one embodiment of the present invention also includes the fault analyzer 112. Operations of the storage device 100 including operations of the fault analyzer 112 may be explained using a flowchart 200 of FIG. 2. Referring to FIG. 2 but continuing to refer to FIG. 1, in the illustrated embodiment, testing for the memory 104 is run by the BIST 108. The BIST 108 runs the test by writing known data value to a selected address within the memory 104. Operation 202. The BIST 108, also connected to the fault analyzer 112, forwards the address of the memory location being tested and the expected value to the fault analyzer 112. The fault analyzer 112, connected to the memory 104, reads the stored value from the address of the memory 104 and compares the stored value to the expected value received from the BIST 108. Operation 204. If the stored data is equal to the expected data, then no action is taken by the fault analyzer 112. However, if the stored data is not equal to the expected data, then a faulty bit is found, and the fault analyzer 112 is updated with the address of the faulty bit. Operation 206. As indicated by loop 208, operations 202 to 206 are-repeated for each address within the memory 104. During the testing of all the memory addresses, the fault analyzer 112 determines whether or not the memory 104 is repairable. Operation 210. If the fault analyzer 112 determines that the memory 104 is not repairable, then the fault analyzer 112 may send a signal on the output line 102 indicating that the memory 104 is not repairable, and that testing can be stopped thereby eliminating time required to complete the testing of a bad memory.

The fault analyzer 112 illustrated in more detail in FIG. 3 may be used, in combination with the flowchart 200 of FIG. 2, to discuss the present invention in more detail. Referring to FIG. 3 but continuing to refer to FIG. 2, the fault analyzer 112 may include a comparator 300 to compare the stored data value read from the memory 104 of FIG. 1, to the expected data value. Operation 204. If the expected value and the stored value do not agree, then the address of the memory location being tested is written in a fault analyzer storage 310 which may have sections for row address 311, row address match 312, column address 313, column address match 314, word bit indicator 315, control logic 316, and unmatched fault address 317.

The row address section 311 is preferably wide enough to accommodate any row address of the memory being tested. The column address section 313 is preferably wide enough to accommodate any column address of the memory being tested. The row address match section 312, the column address match section 314, and the unmatched fault address section 317 are, in one embodiment, one bit wide. The row match bit indicates, when set, that the row identified by the row address must be replaced with a redundant row. The column match bit indicates, when set, that the column identified by the column address must be replaced with a redundant column. The unmatched fault address bit indicates, when set, that the fault address identified by the row address and the column address does not have a matching fault bit in the same column or in the same row. Thus, that faulty bit must be replaced by either a redundant row or a redundant column. The word bit section 315 may be used in cases where the row address and the column address indicate a word, rather than a bit, and where the word includes multiple bits. For such configurations, the word bit section 315 preferably indicates the faulty bit or bits within the word identified by the row and the column addresses. If the row and the column addresses are sufficient to identify the faulty bit, the word bit section 315 may not be used. The control logic section 316 may include logic functions internal to the fault analyzer 112 such as an initial reset operation or index pointer to a next available entry within the fault analyzer 112.

UPDATING THE FAULT ANALYZER

As already discussed, the memory 104 of FIG. 1 typically stores bits of data each of which is addressable using a row address and a column address or a row address and a combination of a column address and the word bit position (s). When a faulty bit is found, the fault analyzer storage 310 is examined to determine whether the row address or the column and word bit position address of the faulty bit (the "current faulty bit") already exists within one of existing entries of the fault analyzer storage 310. For simplicity, the present example assumes that the word is one bit wide; however, in practice, the word may be many bits wide, and the column address may include the word bit fault location; however, the principle of operation of the present invention is same whether or not the word bit position indicator is used to identify a faulty bit.

Case 1

If neither the row address nor the column address of the faulty bit exists within the fault analyzer storage 310, then a new entry is created. The new entry is created by storing the row address and the column address of the faulty bit in the row address section 311 and the column address section 313, respectively. And, a corresponding unmatched fault address bit 317 is set. Neither the row address match bit nor the column address match bit are set because, at this point of the fault analysis process, determination as to whether the row or the column should be replaced is not made.

Case 2a

If only the row address of the faulty bit appears within an entry of the fault analyzer storage 310, then that entry is examined and may be updated.

For that entry, if the unmatched fault address bit 317 is set, then that bit indicates that only one faulty bit has been identified on that row and on that column. In this case, the row address match bit 312 is set and the unmatched fault address bit 317 is reset. As already discussed, the row (or column) address match bit 312 (or 314) indicates that the identified row (or column) should be replaced by a redundant row (or column). Replacement of the row replaces both the previously identified faulty bit and the current faulty bit. Thus, neither the column identified by the column address of the previously identified faulty bit nor the column identified by the column address of the currently faulty bit need be replaced.

If the row address match bit 312 of that entry is set and the column address match bit 314 of that entry is reset, then no action is taken for the same reasons.

If the row address match bit 312 of that entry is reset and the column address match bit 314 of that entry is set, then no action is taken for that entry and the examination of the fault analyzer storage 310 for an existing entry matching the row address of the faulty bit is continued. If none is found, then a new entry is created as explained above. If an entry is found, then that entry is examined as explained above.

Case 2b

If only the column address of the faulty bit appears within an entry of the fault analyzer storage 310, then that entry is examined and may be updated.

For that entry, if the unmatched fault address bit 317 is set, then that bit indicates that only one faulty bit has been identified for that row and on that column. In this case, the column address match bit 314 is set and the unmatched fault address bit 317 is reset. As already discussed, the column (or row) address match bit 314 (or 312) indicates that the identified column (or row) should be replaced by a redundant column (or row). Replacement of the column replaces both the previously identified faulty bit and the current faulty bit. Thus, neither the row identified by the row address of the previously identified faulty bit nor the row identified by the row address of the currently faulty bit need be replaced.

If the column address match bit 314 of that entry is set and the row address match bit 312 of that entry is reset, then no action is taken for the same reasons.

If the column address match bit 314 of that entry is reset and the row address match bit 312 of that entry is set, then no action is taken for that entry and the examination of the fault analyzer storage 310 for an existing entry matching the column address of the faulty bit is continued. If none is found, then a new entry is created as explained above. If an entry is found, then that entry is examined as explained above.

EXAMPLE

The above process may be illustrated using a sample memory having three rows and four columns of bits, each bit 20 addressable in (row, column) format where bits (1, 2), (1, 3), (2, 2), and (3, 4) are faulty, and where the sample memory has two redundant rows and two redundant columns.

The sample memory is illustrated by TABLE 1 below.

TABLE 1

|       | Col. 1 | Col. 2 | Col. 3 | Col. 4 |
|-------|--------|--------|--------|--------|
| Row 1 | good   | fault  | fault  | good   |
| Row 2 | good   | fault  | good   | good   |
| Row 3 | good   | good   | good   | fault  |

The sample memory may be tested row-wise first then column-wise, or column-wise first then row-wise. For the present example, assume that each column of each row is tested first. At the initialization process, the entire fault analyzer storage 310 may be reset. When bit (1, 2) is found faulty, a new entry is created having the form indicated by TABLE 2.

TABLE 2

| Unmatched fault addr. bit | Row address match | Row address | Column address match | Column address |
|---|---|---|---|---|
| 1 | 0 | 1 | 0 | 2 |

When bit (1, 3) is found faulty, the entry for bit (1, 2) is examined because that entry has the same row number as bit (1, 3). Then, that entry is updated by resetting the unmatched fault address match bit, and the fault analyzer storage may be updated to appear as illustrated by TABLE 3.

TABLE 3

| Unmatched fault addr. bit | Row address match | Row address | Column address match | Column address |
|---|---|---|---|---|
| 0 | 1 | 1 | 0 | 2 |

When bit (2, 2) is found faulty, the entry for bit (1, 2) is examined because that entry has the same column number as bit (2, 2). However, that entry is not updated because the column address match is not set. Rather, a new entry is created for the faulty bit (2, 2), and the fault analyzer storage 310 may appear as illustrated by TABLE 4.

TABLE 4

| Unmatched fault addr. bit | Row address match | Row address | Column address match | Column address |
|---|---|---|---|---|
| 0 | 1 | 1 | 0 | 2 |
| 1 | 0 | 2 | 0 | 2 |

When bit (3, 4) is found faulty, neither row 3 or column 4 is found in the faulty analyzer storage 310. Accordingly, a new entry is created and the fault analyzer storage 310 may appear as illustrated by TABLE 5.

TABLE 5

| Unmatched fault addr. bit | Row address match | Row address | Column address match | Column address |
|---|---|---|---|---|
| 0 | 1 | 1 | 0 | 2 |
| 1 | 0 | 2 | 0 | 2 |
| 1 | 0 | 3 | 0 | 4 |

DETERMINING REPAIRABILITY

Continuing to refer to FIGS. 2 and 3, following or at the same time as the steps 202, 204, and 206, set bits in the row address match section 312, set bits in the column address match section 314, and set bits in the unmatched fault address bit 317 are continually counted. The number of bits in the row address match section 312 indicates the number of-rows requiring replacement. The number of bits in the column address match section 314 indicates the number of columns requiring replacement. The number of bits in the unmatched fault address section 317 indicates the number of row or columns requiring replacement.

The bits in the row address match section 312 may be counted by a register or a count and compare circuit 320.

The count and compare circuit 320 preferably compares the row address match bit count to a first predetermined number, the number of redundant rows available for the memory 104 of FIG. 1 being tested, and generates a row repairability output 321. In one embodiment, if the count of the row address match bits is greater than the available number of redundant rows, then the output 321 is positive. Otherwise, the output 321 is negative. A positive output at 321 signifies that the memory 104 is not repairable.

Similarly, the bits in the column address match section 314 may be counted by a register or another count and compare circuit 322. The count and compare circuit 322 preferably compares the column address match bit count to a second predetermined number, the number of redundant columns available for the memory 104 of FIG. 1 being tested, and generates a column repairability output 323. In one embodiment, if the count of the column address match bits is greater than the available number of redundant columns, then the output 323 is positive. Otherwise, the output 323 is negative. A positive output at 323 signifies that the memory 104 is not repairable.

Furthermore, the bits in the unmatched fault address section 317 may be counted by a register or yet another count and compare circuit 324. The count and compare circuit 324 preferably compares a sum (a "first sum") of the counts of row address match bit, column address match bit, and unmatched fault address bits to a sum (a "second sum") of the first and the second predetermined numbers, and generates a total repairability output 325. In one embodiment, if the first sum is greater than the second sum, then the output 325 is positive. Otherwise, the output 325 is negative. A positive output at 325 signifies that the memory 104 is not repairable.

In one embodiment, the row repairability output 321, the column repairability output 323, and the total repairability output 325 are summed by a memory repairability indicator gate 326 to generate a memory repairability output 327. The memory repairability indicator gate 326 may be an OR gate.

Although a specific embodiment of the invention has been described and illustrated, the invention is not to be limited to the specific forms or arrangements of parts so described and illustrated. For example, the memory under test may include redundant rows only or redundant columns only. The present application may be implemented for such devices also. Moreover, instead of the BIST, an external tester may be used to test the memory. The invention is limited only by the claims.

What is claimed is:

1. An apparatus comprising:
    memory having addressable storage locations;
    fault analyzer for storing address of a fault location within the memory;
    wherein the fault analyzer determines repairability of the apparatus based on a sum comparison.

2. The apparatus recited in claim 1 wherein the memory resides within an integrated circuit.

3. The apparatus recited in claim 1 wherein the memory resides within a device comprising at least one from a group comprising random access memory (RAM), DRAM (dynamic RAM), SRAM (static RAM), SDRAM (Synchronous DRAM), VDRAM (Video DRAM), other RAM implementations, PROM (Programmable Read Only Memory), PGA (Programmable Gate Array), and ASIC (Application Specific Integrated Circuit).

4. The apparatus recited in claim 1 wherein the fault analyzer comprises:
    data comparator for comparing an expected data and an actual data to determine fault location at a memory address; and
    fault analyzer storage for storing address of the detected fault location within the memory.

5. The apparatus recited in claim 4 wherein the fault analyzer further comprises a row count and compare circuit for determining row match count and for comparing the row match count to a first predetermined value to determine row repairability status.

6. The apparatus recited in claim 5 further comprising a column count and compare circuit for determining column match count and for comparing the column match count to a second predetermined value to determine column repairability status.

7. The apparatus recited in claim 6 further comprising an unmatched fault address count and compare circuit for comparing a first sum including the column match count, the row match count, and a unmatched fault address count to a second sum including the first predetermined number and a second predetermined number to determine repairability of the apparatus.

8. The apparatus recited in claim 4 wherein the fault address storage comprises:
    row address section for storing row address of a fault memory location; and
    row match section for row match information.

9. The apparatus recited in claim 8 further comprising means for determining a number of row matches.

10. The apparatus recited in claim 9 further comprising means for determining whether the number of row matches exceeds a first predetermined number.

11. The apparatus recited in claim 10 further comprising means for indicating whether the number of row matches exceed the first predetermined number.

12. The apparatus recited in claim 4 wherein the fault address storage comprises:
    column address section for storing column address of the fault memory location; and
    column match section for column match information.

13. The apparatus recited in claim 12 wherein the fault address storage further comprises a word bit section.

14. The apparatus recited in claim 13 further comprising means for determining a number of column matches.

15. The apparatus recited in claim 14 further comprising means for determining whether a number of column matches exceeds a second predetermined number.

16. The apparatus recited in claim 15 further comprising means for indicating whether the number of column matches exceed the second predetermined number.

17. The apparatus recited in claim 4 wherein the fault address storage comprises:
    row address section for storing row address of the fault memory location;
    column address section for storing column address of the fault memory location; and
    unmatched fault address section.

18. A method of testing a device having memory with addressable location, said method comprising:
    comparing expected data with actual data;
    storing, when the expected data is not equal to the actual data, address of memory location within the memory device; and comparing sums of a plurality of stored memory address location parameters to assess repairability of the device.

19. The method recited in claim 18 wherein the address comprises a row address and a column address and the method further comprising a step of updating a row match section when a second address having an existing row address is found.

20. The method recited in claim 19 further comprising a step of determining whether a total number of row match is greater than a predetermined number.

21. The method recited in claim 20 further comprising a step of indicating a condition where the total number of row match is greater than a predetermined number.

22. The method recited in claim 18 wherein the address comprises a row address and a column address and the method further comprising a step of updating a column match section when a third address having an existing column address is found.

23. The method recited in claim 22 further comprising a step of determining whether a total number of column match is greater than a predetermined number.

24. The method recited in claim 23 further comprising a step of indicating a condition where the total number of column match is greater than a predetermined number.

* * * * *